(12) United States Patent
Kishino et al.

(10) Patent No.: US 7,126,194 B2
(45) Date of Patent: Oct. 24, 2006

(54) METHOD FOR REMOVING IMPURITIES OF A SEMICONDUCTOR WAFER, SEMICONDUCTOR WAFER ASSEMBLY, AND SEMICONDUCTOR DEVICE

(75) Inventors: Seigo Kishino, Kobe (JP); Hideki Tsuya, Yokohama (JP)

(73) Assignees: Hyogo Prefecture, Kobe (JP); Japan Society for the Promotion of Science, Tokyo (JP)

( * ) Notice: Subject to any disclaimer, the term of this patent is extended or adjusted under 35 U.S.C. 154(b) by 0 days.

(21) Appl. No.: 10/703,583

(22) Filed: Nov. 10, 2003

(65) Prior Publication Data
US 2004/0150087 A1    Aug. 5, 2004

(30) Foreign Application Priority Data
Nov. 20, 2002    (JP)    ............... 2002-336398

(51) Int. Cl.
*H01L 27/12*    (2006.01)
(52) U.S. Cl. .................. 257/347; 257/213; 257/288; 257/913; 257/E21.318; 438/142; 438/143
(58) Field of Classification Search ............... 257/678, 257/682, 347; 438/149, 479, 317
See application file for complete search history.

(56) References Cited

U.S. PATENT DOCUMENTS 4,131,487 A * 12/1978 Pearce et al.
4,249,962 A * 2/1981 Celler
6,153,495 A * 11/2000 Kub et al.
6,252,294 B1 * 6/2001 Hattori et al.
6,958,264 B1 * 10/2005 Lin

FOREIGN PATENT DOCUMENTS

JP    63-38235    * 2/1988
WO    WO 9926291    * 5/1999

* cited by examiner

*Primary Examiner*—Nathan J. Flynn
*Assistant Examiner*—Kevin Quinto
(74) *Attorney, Agent, or Firm*—Oliff & Berridge, PLC

(57) ABSTRACT

On a silicon layer of an SOI wafer is defined a semiconductor device-forming region to form semiconductor devices thereon and an insulating region to electrically insulate the semiconductor device-forming region. Then, a mask layer is formed of nitride by means of photolithography so as to cover the semiconductor device-forming region. Then, an impurities-removing layer is formed by means of well known technique so as to cover the mask layer and embed the gaps between the adjacent masks of the mask layer. The impurities of the silicon layer of the SOI wafer are absorbed and removed by the distorted layer, the grain boundaries and the lattice defects of the impurities-removing layer.

22 Claims, 8 Drawing Sheets

METHOD FOR REMOVING IMPURITIES OF A SEMICONDUCTOR WAFER, SEMICONDUCTOR WAFER ASSEMBLY, AND SEMICONDUCTOR DEVICE

BACKGROUND OF THE INVENTION

1. Field of the Invention

This invention relates to a method for removing impurities of a semiconductor wafer such as a silicon wafer or a SOI wafer, and to a semiconductor wafer assembly which is made during the removing process of the impurities of the semiconductor wafer. This invention also relates to a semiconductor device utilizing the semiconductor wafer cleaned in impurities by the above removing method.

2. Description of the Related Art

In a semiconductor device made of a semiconductor wafer and various semiconductor components formed on the semiconductor wafer, it was important problem to remove heavy metal impurities of a semiconductor device during the fabricating process because the performance of the semiconductor device is deteriorated if the heavy metal impurities are incorporated in the semiconductor device even in minute amount.

If the heavy metal impurities are incorporated in the semiconductor device to deteriorate the performance thereof, the product yield of IC circuit or LSI circuit composed of many integrated semiconductor devices is decreased conspicuously and thus, the IC circuits or the LSI circuits can not be fabricated profitably.

With the semiconductor device, the fundamental performance depends on the condition of p-n junction thereof. For example, with the I–V characteristic of the semiconductor device, as illustrated in the solid line of FIG. 1, when positive voltage is applied to the p-n junction, the current "I" is increased remarkably, and when negative voltage is applied to the p-n junction, the current I becomes very small up to almost zero. The illustrated characteristic is generally called as a "rectification of p-n junction".

If there is a small amount of harmful heavy metal impurity in the vicinity of the p-n junction of the semiconductor device, as illustrated in the broken line of FIG. 1, when negative voltage is applied to the p-n junction, the current I is increased inversely (that is, a negative current is generated). The negative current is originated from a leak current in the p-n junction due to the heavy metal impurities. If the leak current is increased, the normal rectification of the p-n junction can not be realized, so that semiconductor devices with such p-n junctions as mentioned above are ranked as defective ones.

In order not to deteriorate the fundamental performance of the semiconductor device, it is required to remove the heavy metal impurities from a surface of a semiconductor wafer constructing the semiconductor device before the fabricating process of the semiconductor device or during the fabricating process. The removing operation of heavy metal impurity is called as a "Gettering treatment".

For example, as illustrated in FIG. 2, a polycrystalline silicon film 5 is formed on the rear surface of a semiconductor wafer 3 so that harmful impurities of the surface region 6 on which semiconductor devices are fabricated are removed by the polycrystalline silicon film 5 and the nearby silicon layer. In addition, as illustrated in FIG. 3, minute defects 8 such as precipitated oxides and the related products are created so that the heavy metal impurities are absorbed by the minute defects 8. The latter operation is called as an "Intrinsic Gettering treatment".

The above-mentioned conventional removing methods illustrated in FIGS. 2 and 3 are available in a conventional semiconductor wafer fabricating process and a conventional semiconductor device fabricating process utilizing the semiconductor wafer.

With a recent state-of-the-art LSI device, a SOI (Silicon-On-Insulator) wafer is practically employed as a semiconductor wafer so as to realize the high density integration, high speed and low electric power consumption performance thereof. As illustrated partially in FIG. 4, the SOI wafer is a wafer 13 made of a silicon substrate 10 and a thin silicon layer 12 with a thickness of 1 µm or below formed on the silicon substrate 10 via an insulator 11. Various semiconductor components are provided on the thin silicon layer 12 to fabricate the intended semiconductor device. Since the insulator 11 is generally made of oxide and embedded in the wafer, it is called a "BOX (Buried Oxide) layer".

With the SOI wafer with the BOX layer, it is difficult to remove the harmful heavy metal impurities of the thin silicon layer 12 due to the BOX layer 11 because the diffusion velocities of the heavy metal impurities such as iron and nickel in an oxide film are very small and thus, the heavy metal impurities can not be removed through the BOX layer as an oxide layer by the Gettering treatment. Next, the impediment process of the BOX layer will be described with reference to FIGS. 5 and 6.

As illustrated in FIGS. 5 and 6, when a polycrystalline silicon film 15 is formed on the rear surface of a semiconductor wafer 14 or minute defects 21 are created to remove the heavy metal impurities of the surface regions of SOI silicon layers 17 and 22, the heavy metal impurities can not be passed through the BOX layers 18 and 23. Therefore, the heavy metal impurities can not be removed by the polycrystalline silicon layer 15 or the minute defects 21 on the conventional removing technique.

SUMMERY OF THE INVENTION

It is an object of the present invention to remove impurities such as heavy metal impurities of a semiconductor wafer such as a SOI wafer even in minute amount which is difficult by a conventional technique, to provide a cleaned semiconductor wafer.

It is another object of the present invention to provide a semiconductor device utilizing the cleaned semiconductor wafer obtained from the removing technique of impurities.

For achieving the above object, this invention relates to a method for removing impurities of a semiconductor wafer, comprising the steps of:

preparing a semiconductor wafer, and forming an impurities-removing region on the semiconductor wafer to remove impurities of the semiconductor wafer through gettering.

According to the present invention, since the impurities-removing region is directly provided on the semiconductor wafer to perform the gettering treatment for the impurities of the surface region of the semiconductor wafer by the impurities-removing region, the impurities can be removed effectively and efficiently, compared with conventional techniques such as a gettering treatment utilizing a polycrystalline silicon film or an intrinsic gettering treatment utilizing minute defects. For example, since the impurities-removing region is directly formed on the SOI wafer, the impurities of the surface thin silicon layer of the SOI wafer can be removed effectively and efficiently without the impediment of the BOX layer formed in the SOI wafer.

Therefore, if a semiconductor device is made of the semiconductor wafer from which impurities are removed on the above-mentioned technique, a satisfactory p-n junction can be made in the semiconductor device and thus, the performance of the semiconductor device can not be almost deteriorated.

In a preferred embodiment of the present invention, the impurities-removing region is provided so as to include an insulating region which insulates a semiconductor device-forming region electrically of the semiconductor wafer. In this case, since the semiconductor-forming region is not narrowed and contaminated by the impurities-removing region, the subsequent semiconductor device fabricating process can not be affected by the semiconductor device-forming region. Therefore, the product yield and the performance of the semiconductor device can not be almost deteriorated.

In another preferred embodiment of the present invention, the impurities-removing region is removed after the gettering treatment. Instead of the removal of the impurities-removing region, an insulating treatment may be performed onto the surface impurities-removing region of the semiconductor wafer. In the latter case, some components of the semiconductor device can not be affected by impurities from the impurities-removing region during the high temperature semiconductor device fabricating process followed.

In still another preferred embodiment, the gettering treatment is performed while the semiconductor wafer is heated to 400° C. or over. In this case, the impurities are activated by the thermal energy and thus, diffused rapidly, so that the impurities can be removed more effectively and efficiently from the semiconductor wafer.

For example, the impurities-removing region may be made of a distorted layer formed on the semiconductor wafer. In this case, the impurities of the surface region of the semiconductor wafer can be absorbed and removed by the defects of the distorted layer.

The impurities-removing region may be made of an impurities-removing layer formed on the semiconductor wafer, particularly so as to be formed adjacent to the semiconductor device-forming region thereof. In this case, the impurities of the surface region of the semiconductor wafer can be absorbed and removed by the impurities-removing layer.

A semiconductor device is characterized in that various semiconductor components are provided on the semiconductor wafer cleaned in impurities by the above-mentioned operation.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail hereinafter.

Figure 1:
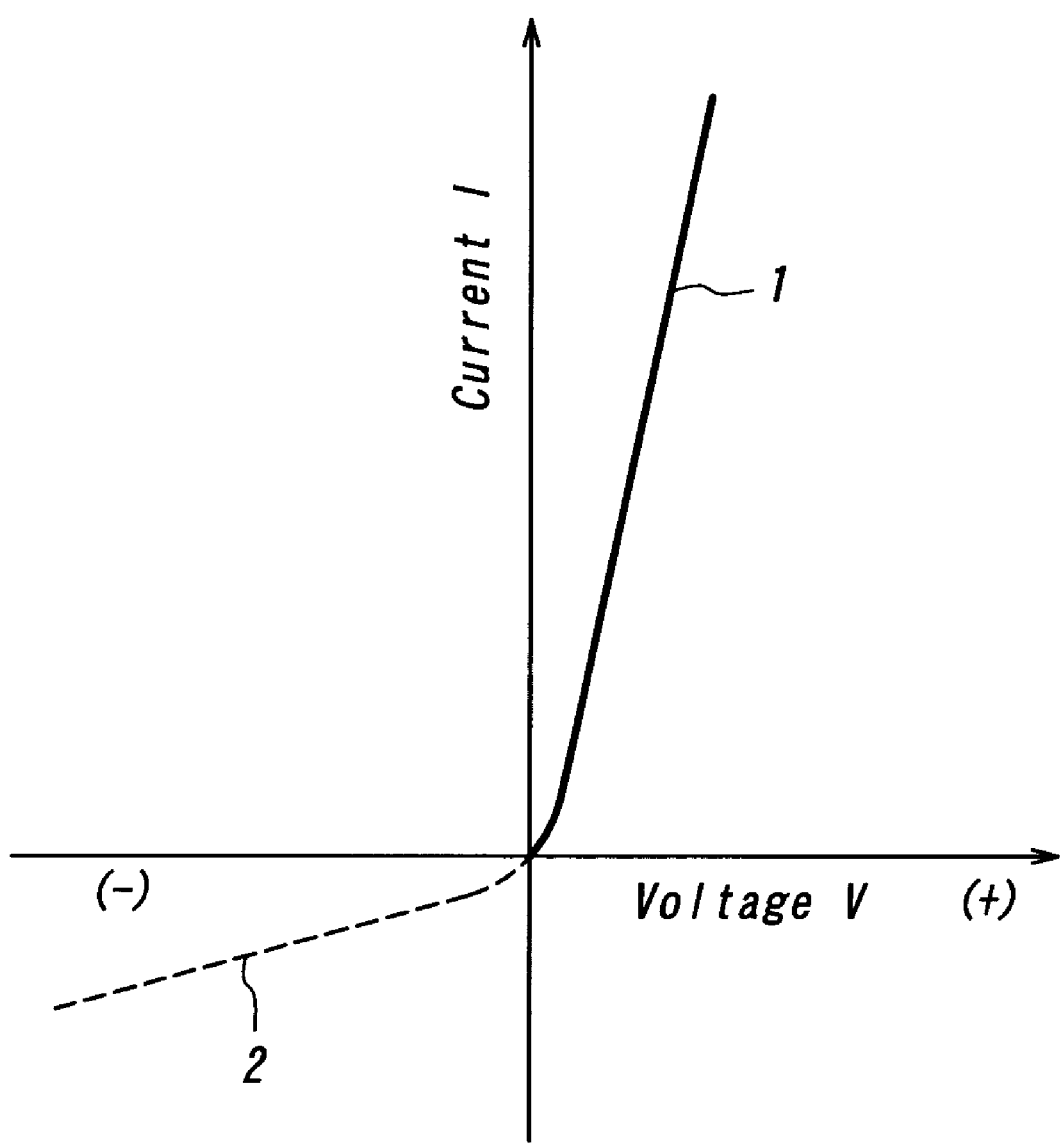
FIG. 1 is a graph showing a voltage-current characteristic of a p-n junction semiconductor device.
Figure 2:
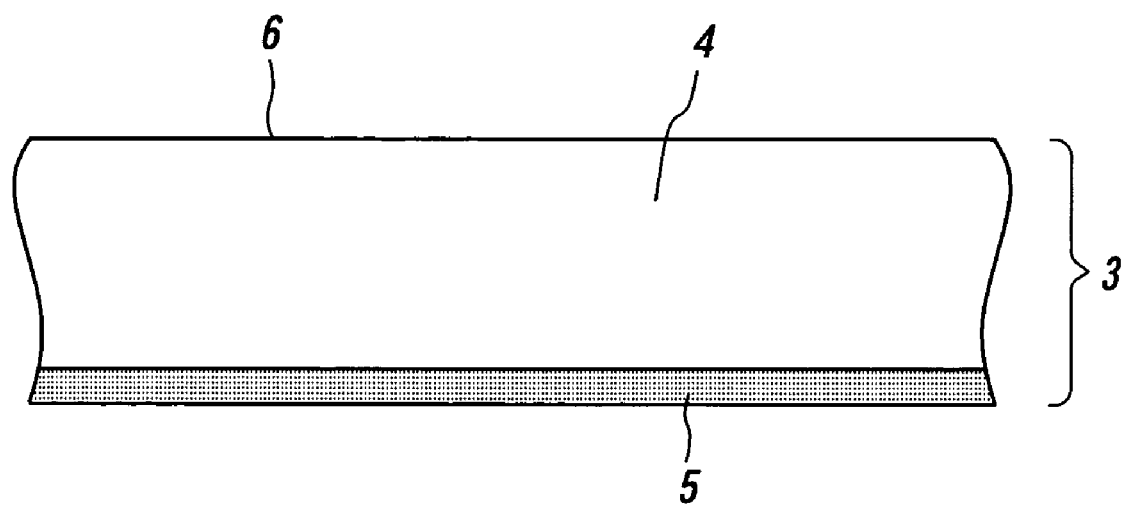
FIG. 2 is an explanatory view showing a conventional impurities-removing method (gettering treatment) for a semiconductor wafer.
Figure 3:
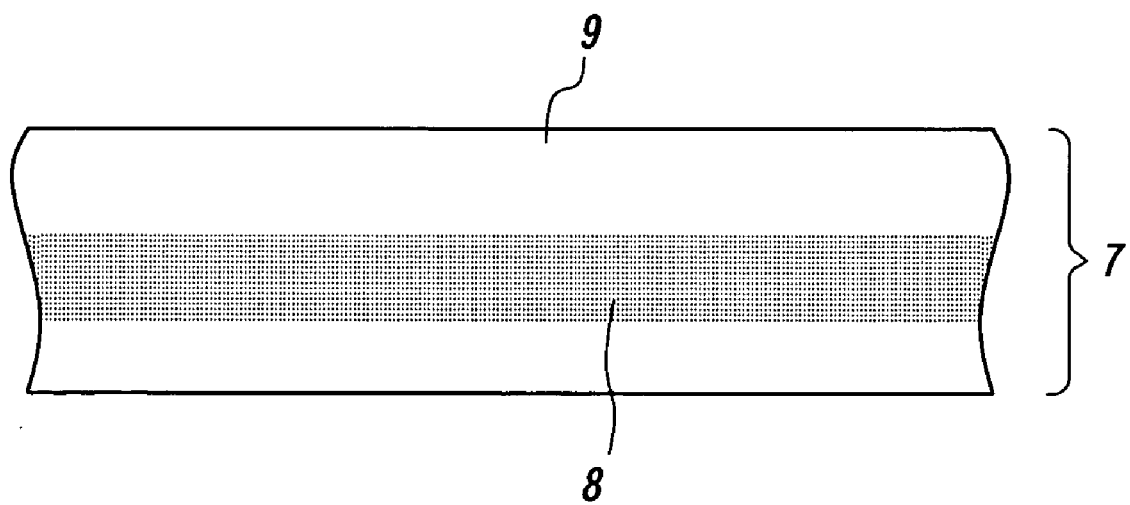
FIG. 3 is an explanatory view showing another conventional impurities-removing method (gettering treatment) for a semiconductor wafer.
Figure 4:
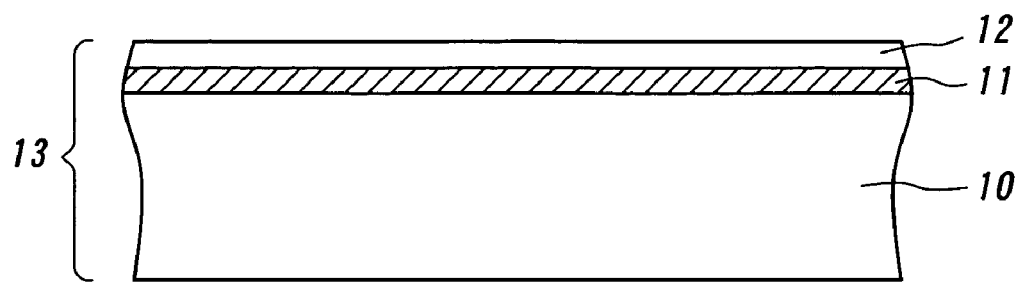
FIG. 4 is a structural view showing an SOI wafer.
Figure 5:
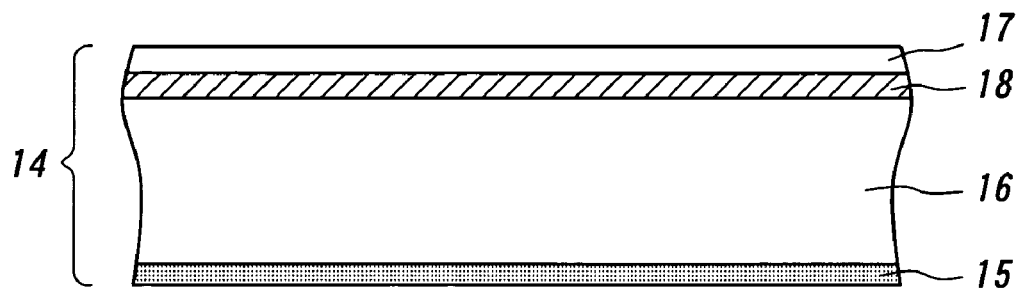
FIG. 5 is a structural view showing an SOI assembly to which the conventional impurities-removing method.
Figure 6:
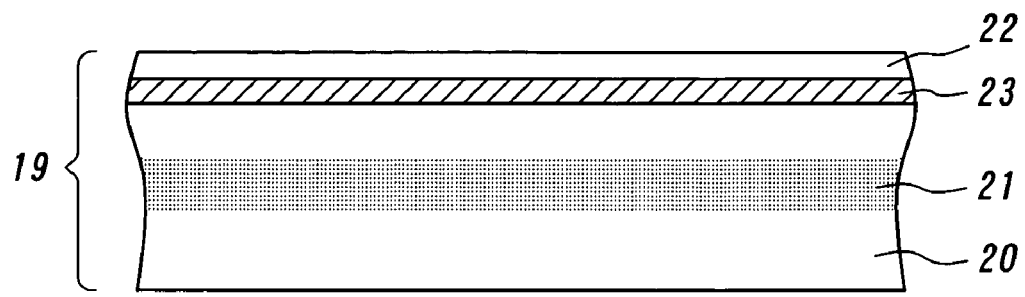
FIG. 6 is another structural view showing an SOI assembly to which the conventional impurities-removing method.
Figure 7:
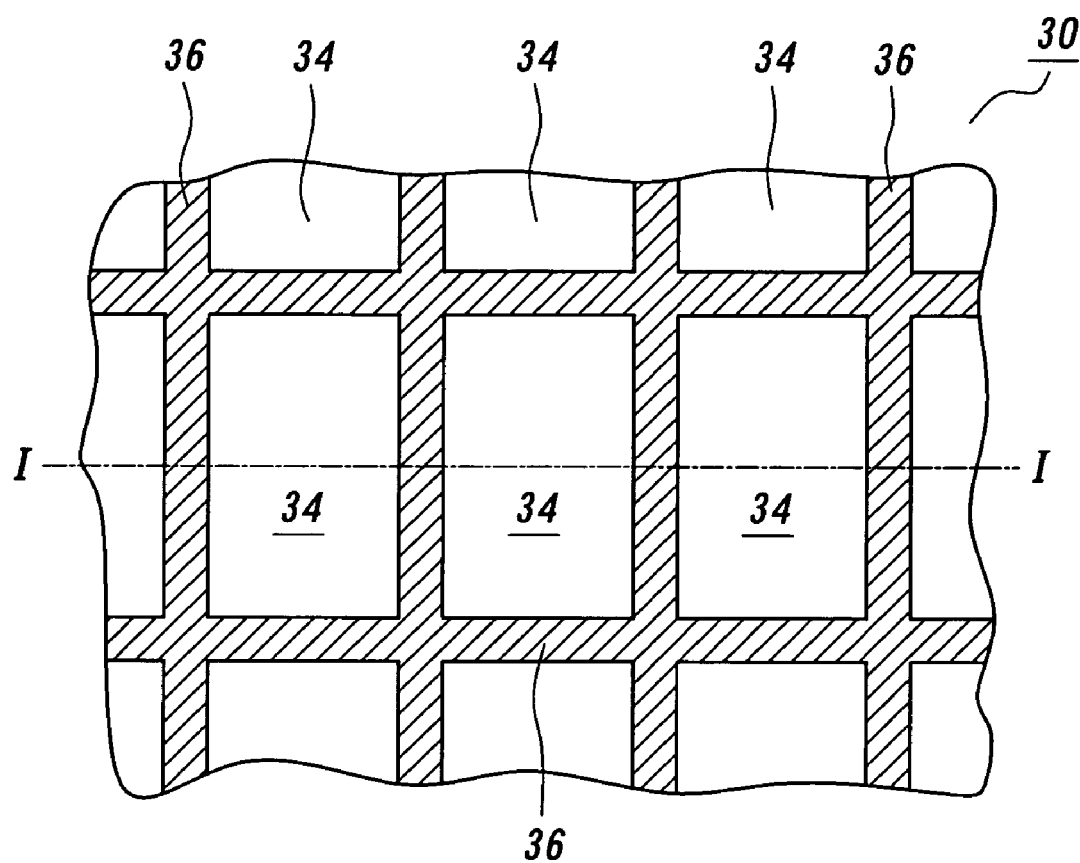
FIG. 7 is a top plan view showing one step in an impurities-removing method according to the present invention.
Figure 8:
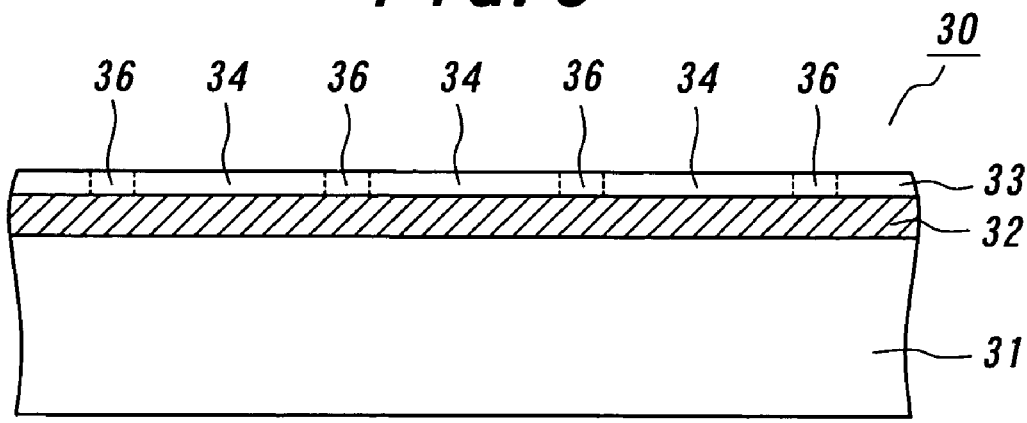
FIG. 8 is a cross sectional view of the semiconductor assembly illustrated in FIG. 7, taken on line "I—I"
Figure 9:
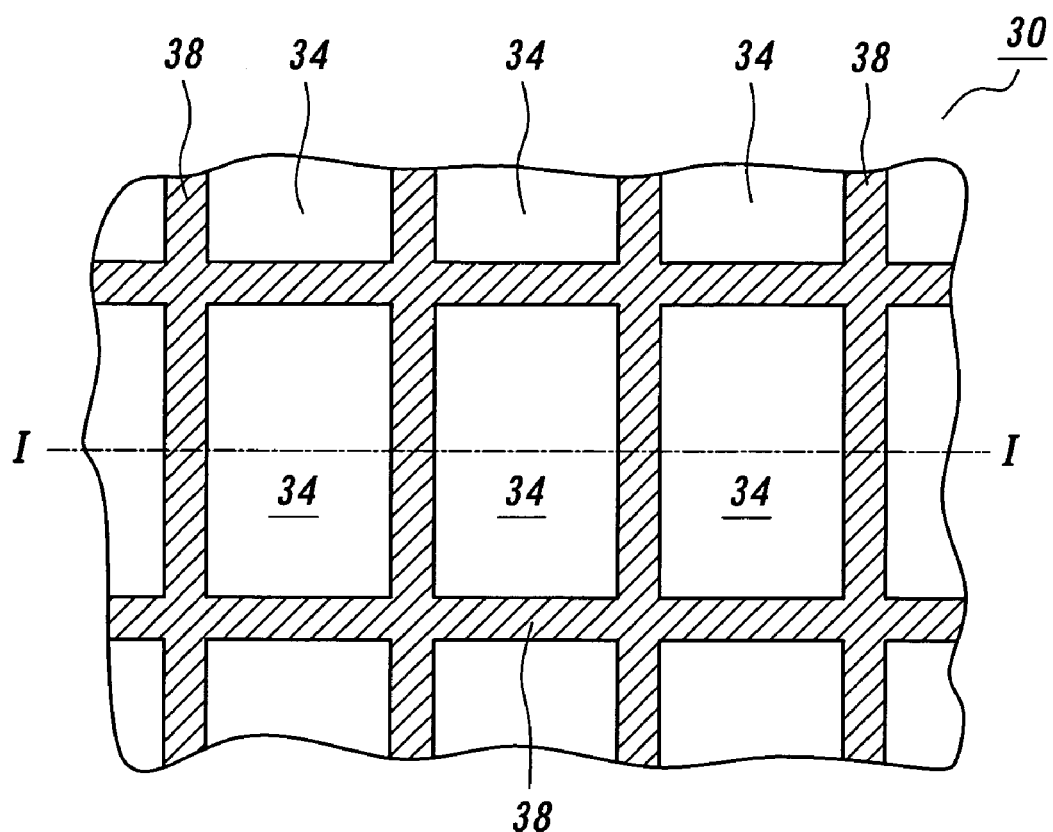
FIG. 9 is a top plan view showing the step after the step shown in FIGS. 7 and 8.
Figure 10:
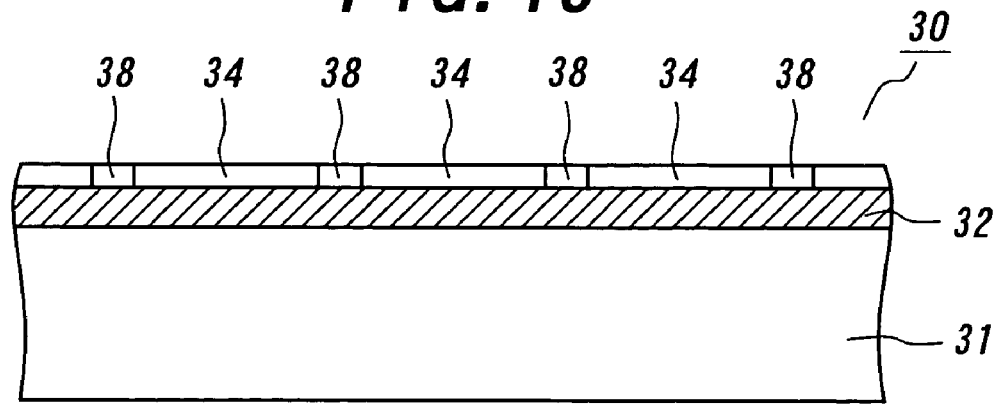
FIG. 10 is a cross sectional view of the semiconductor assembly illustrated in FIG. 9, taken on line "I—I"
Figure 11:
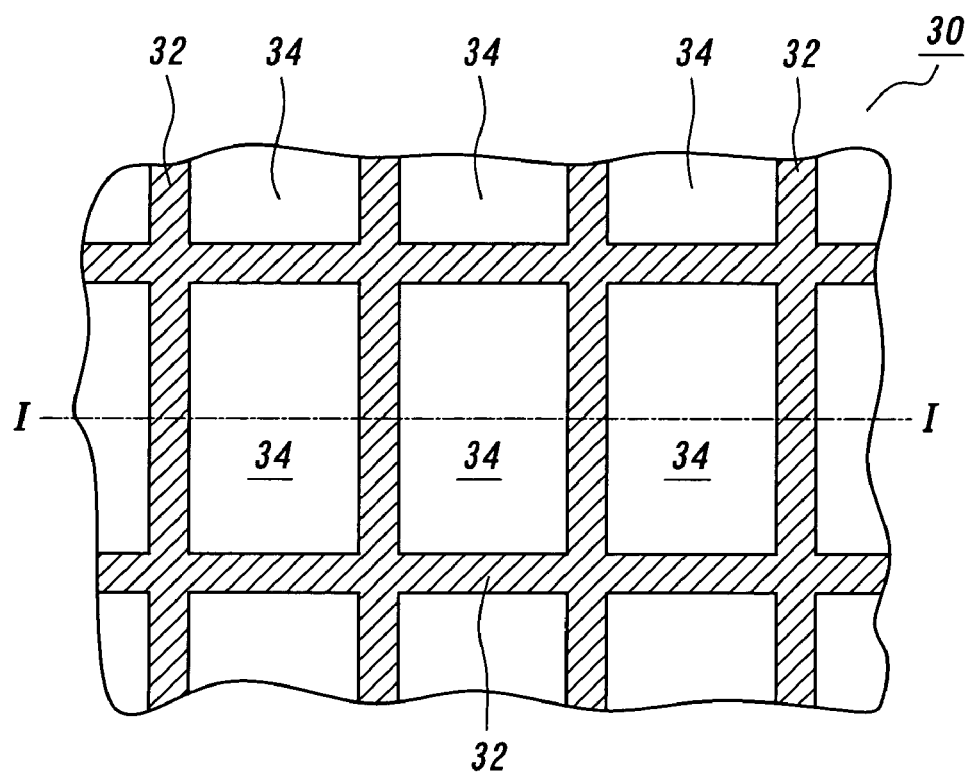
FIG. 11 is a top plan view showing the step after the step shown in FIGS. 9 and 10.
Figure 12:
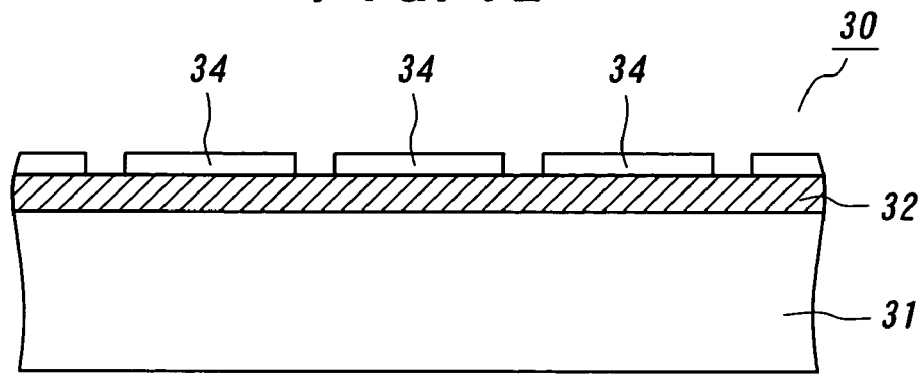
FIG. 12 is a cross sectional view of the semiconductor assembly illustrated in FIG. 11, taken on line "I—I"

FIGS. 7–12 relate to an impurities-removing method according to the present invention. FIGS. 7, 9 and 11 are top plan views showing a semiconductor wafer under operation, and FIGS. 8, 10 and 12 are cross sectional views of the semiconductor wafer, taken on line "I—I". In this embodiment, the impurities-removing method will be carried out for an SOI wafer.

First of all, as shown in FIGS. 7 and 8, an insulating layer 32 made of $SiO_2$ or the like and a silicon layer 33 are formed on a silicon substrate 31 to form an SOI wafer 30. Then, on the silicon layer 33 is defined a semiconductor device-forming region 34 to form semiconductor devices and an insulating region 36 to electrically insulate the semiconductor device-forming region 34.

Then, as shown in FIGS. 9 and 10, mechanical distortion is imparted only to the insulating region 36 to form a distorted layer 38 as an impurities-removing region. Since much lattice defects are contained in the distorted layer 38, impurities of the silicon layer 33 of the SOI wafer 30 are incorporated in the lattice defects. As a result, the impurities particularly such as heavy metal impurities made of Fe and Ni of the surface region (silicon layer 33) of the SOI wafer 30 can be removed effectively and efficiently.

In this embodiment, since the distorted layer 38 is formed only within the insulating region 36 of the SOI wafer 30, the semiconductor device-forming region 34 can not be narrowed and distorted by the distorted layer 38. Therefore, the subsequent semiconductor device-fabricating process can be performed without the impediment of the distorted layer 38.

In the removing (gettering) operation utilizing the distorted layer 38, it is desired that the SOI wafer 30 is heated to 400° C. or over. In this case, since the impurities are activated by the thermal energy, and thus, diffused rapidly, they can be absorbed and removed more effectively and efficiently by the distorted layer 38.

Then, as shown in FIGS. 11 and 12, after the removing of the impurities, the distorted layer 38 with absorption of much impurities is removed so that the semiconductor device-forming region 34 merely remains on the BOX layer. Instead of the removal of the distorted layer 38, the distorted layer may be rendered insulation through oxidization. In this case, in the subsequent semiconductor device-fabricating process, some components of the semiconductor device can not be affected by impurities from the distorted layer 38.

In order to impart the mechanical distortion to the insulating region 36, laser beams may be irradiated from an excimer laser.

Figure 13:
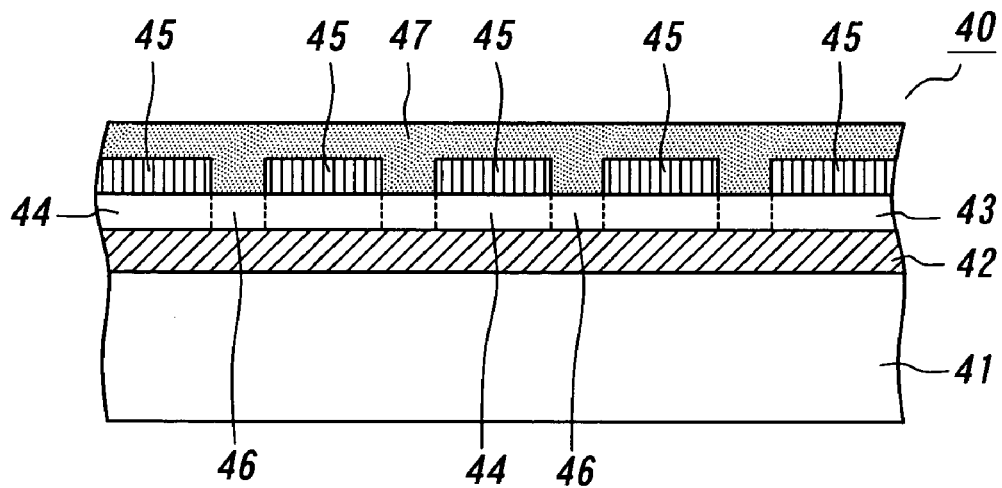
FIG. 13 is a cross sectional view showing one step in another impurities-removing method according to the present invention.
Figure 14:
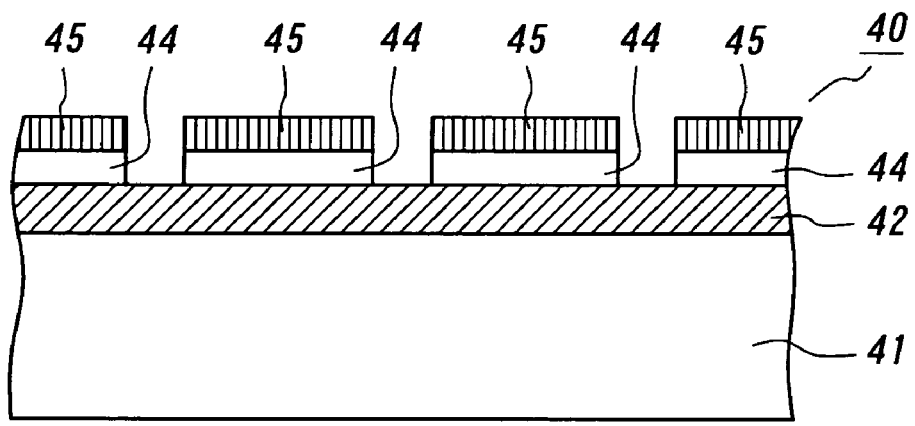
FIG. 14 is a cross sectional view showing the step after the step shown in FIG. 13.
Figure 15:
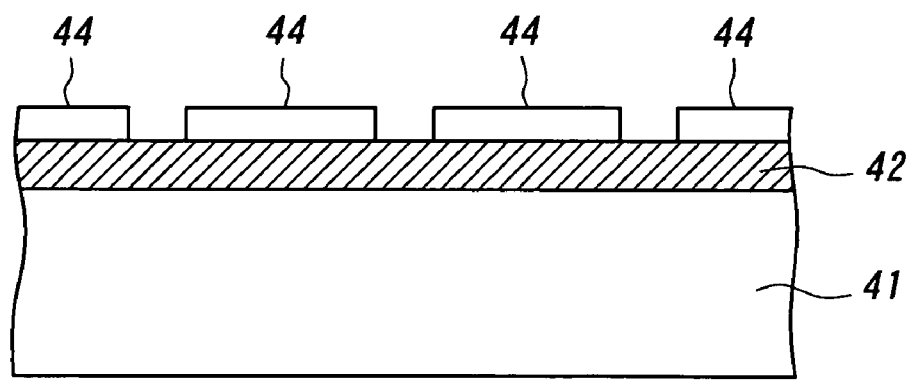
FIG. 15 is a cross sectional view showing the step after the step shown in FIG. 14.

FIGS. 13–15 relate to another impurities-removing method according to the present invention, and show cross sections of the semiconductor wafer assembly under operation.

First of all, as shown in FIG. 13, an insulating layer 42 made of $SiO_2$ or the like and a silicon layer 43 are formed on a silicon substrate 41 to form an SOI wafer 40. Then, on the silicon layer 43 is defined a semiconductor device-forming region 44 to form semiconductor devices and an insulating region 46 to electrically insulate the semiconductor device-forming region 44. Then, a mask layer 45 is formed of nitride by means of photolithography so as to cover the semiconductor device-forming region 44. Then, an impurities-removing layer 47 is formed by means of well known technique so as to cover the mask layer 45 and embed the gaps between the adjacent masks of the mask layer 45. In this case, the impurities-removing layer 47 is contacted with the insulating region 46 of the SOI wafer 30, that is, the silicon layer 43 located at the top of the SOI wafer 30.

In this case, the impurities of the silicon layer 43 of the SOI wafer 40 are absorbed by the distorted layer, the grain boundaries and the lattice defects of the impurities-removing layer 47. That is, the impurities particularly such as heavy metal impurities made of Fe and Ni of the surface region of the SOI wafer 40 can be removed effectively and efficiently.

The impurities-removing layer 47 is preferably made of polycrystalline silicon. In this case, the heavy metal impurities can be removed more effectively and efficiently.

In this embodiment, since the impurities-removing layer 47 is formed only within the insulating region 46 of the SOI wafer 40, the semiconductor device-forming region 44 can not be narrowed and contaminated by the impurities-removing layer 47. Therefore, the subsequent semiconductor device-fabricating process can be performed without the impediment of the impurities-removing layer 47.

In the removing (gettering) operation utilizing the impurities-removing layer 47, it is desired that the SOI wafer 40 is heated to 400° C. or over. In this case, since the impurities are activated by the thermal energy, and thus, diffused rapidly, they can be absorbed and removed more effectively and efficiently by the distorted layer 38.

Then, as shown in FIG. 14, after the removing of the impurities, the impurities-removing layer 47 with absorption of much impurities is removed, and as shown in FIG. 15, the mask layer 45 is removed so that the semiconductor device-forming region 44 remains. In this way, the SOI wafer 40 is cleaned through the removal of the impurities. Instead of the removal of the impurities-removing layer 47, the impurities-removing layer 47 may be rendered insulation through oxidization.

Figure 16:
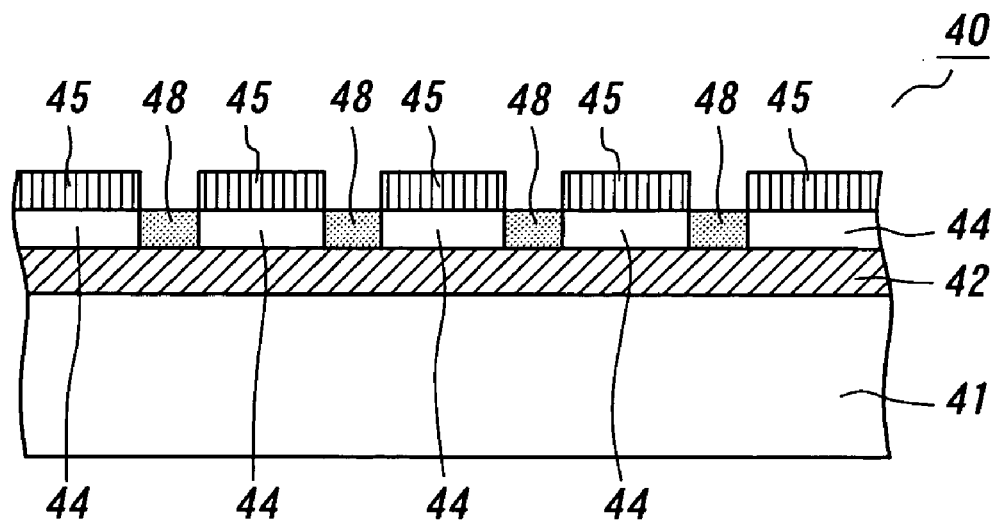
FIG. 16 is a cross sectional view showing one step in still another impurities-removing method according to the present invention which is modified from the one shown in FIGS. 13–15.
Figure 17:
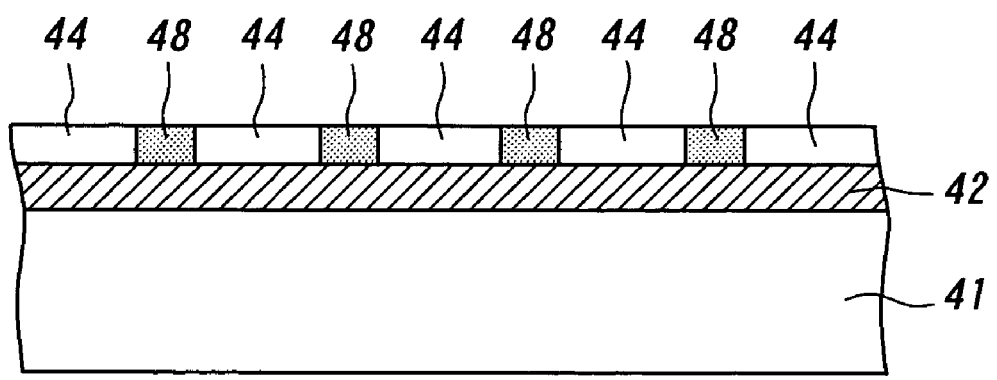
FIG. 17 is a cross sectional view showing the step after the step shown in FIG. 16.

FIGS. 16 and 17 relate to still another impurities-removing method according to the present invention which is modified from the one in the above-mentioned embodiment relating to FIGS. 13–15. In this embodiment, the impurities of the silicon layer 43 of the SOI wafer 40 is removed by the steps shown in FIGS. 13 and 14, and the SOI wafer 40 with the mask layer 45 is disposed in oxidizing atmosphere with heated at 900° C. or over to oxidize the portions of the silicon layer 43 located between the adjacent masks of the mask layer 45 and to form an insulating layer 48.

Then, the mask layer 45 is removed to form the SOI wafer 40 where the semiconductor device-forming region 44 is isolated by the insulating layer 48, as shown in FIG. 17. In this case, the bars of the semiconductor device-forming region 44 can be electrically insulated from one another, so that semiconductor devices integrated on the semiconductor device-forming region 44 can be electrically insulated from one another.

Although the present invention was described in detail with reference to the above examples, this invention is not limited to the above disclosure and every kind of variation and modification may be made without departing from the scope of the present invention.

As mentioned above, according to the present invention, impurities such as heavy metal impurities of a semiconductor wafer such as a SOI wafer even in minute amount can be removed, which is difficult by a conventional technique, to provide a cleaned semiconductor wafer. In addition, by utilizing the cleaned semiconductor wafer, a semiconductor device with good performance can be obtained.

What is claimed is:

1. A method for removing impurities of a semiconductor wafer, comprising the steps of:
   preparing said semiconductor wafer;
   forming an impurities-removing region in an insulating region of said semiconductor wafer which insulates a semiconductor device-forming region electrically of said semiconductor wafer, thereby removing impurities of said semiconductor wafer through gettering; and
   insulating said impurities-removing region after said gettering,
   wherein said impurities-removing region is made of a distorted layer formed on said semiconductor wafer.

2. A semiconductor device comprising a semiconductor wafer cleaned in impurities by a removing method as defined in claim 1.

3. A method for removing impurities of a semiconductor wafer, comprising the steps of:
   preparing said semiconductor wafer;
   forming a mask layer on said semiconductor wafer so as to cover a semiconductor device-forming region;
   forming an impurities-removing layer so as to cover said mask layer and embed gaps between adjacent masks of said mask layer to remove impurities of said semiconductor wafer through gettering; and
   removing said impurities-removing region after said gettering.

4. A semiconductor device comprising a semiconductor wafer cleaned in impurities by a removing method as defined in claim 3.

5. The removing method as defined in claim 3, wherein said impurities-removing layer is made of polycrystalline silicon.

6. A semiconductor device comprising a semiconductor wafer cleaned in impurities by a removing method as defined in claim 5.

7. The removing method as defined in claim 3, further comprising the step of oxidizing portions of said semiconductor wafer located between adjacent masks of said mask layer to form an insulating layer to electrically insulate said semiconductor device-forming region.

8. A semiconductor device comprising a semiconductor wafer cleaned in impurities by a removing method as defined in claim 7.

9. The removing method as defined in claim 7, wherein said insulating layer is formed by heating said semiconductor wafer at 900° C. or over in oxidizing atmosphere.

10. A semiconductor device comprising a semiconductor wafer cleaned in impurities by a removing method as defined in claim 9.

11. The removing method as defined in claim 3, wherein said gettering is performed while said semiconductor wafer is heated at 400° C. or over.

12. A semiconductor device comprising a semiconductor wafer cleaned in impurities by a removing method as defined in claim 11.

13. The removing method as defined in claim 3, wherein said impurities are heavy metal impurities.

14. A semiconductor device comprising a semiconductor wafer cleaned in impurities by a removing method as defined in claim 3.

15. The removing method as defined in claim 3, wherein said semiconductor wafer is an SOI wafer.

16. A semiconductor device comprising a semiconductor wafer cleaned in impurities by a removing method as defined in claim 15.

17. A semiconductor wafer assembly, comprising:
a semiconductor wafer;
a mask layer formed on said semiconductor wafer so as to cover a semiconductor device-forming region; and
an impurities-removing layer formed so as to cover said mask layer and embed gaps between adjacent masks of said mask layer to remove impurities of said semiconductor wafer through gettering.

18. The semiconductor wafer assembly as defined in claim 17, wherein said impurities-removing layer is made of polycrystalline silicon.

19. The semiconductor wafer assembly as defined in claim 17, wherein said impurities are heavy metal impurities.

20. The semiconductor wafer assembly as defined in claim 17, wherein said semiconductor wafer is an SOI wafer.

21. A method for removing impurities of a semiconductor wafer, comprising the steps of:
preparing a semiconductor wafer; and
forming an impurities-removing region on said semiconductor wafer to remove impurities of said semiconductor wafer through gettering, wherein
said impurities-removing region is formed so as to include an insulating region which insulates a semiconductor device-forming region electrically of said semiconductor wafer,
said impurities-removing region is made of an impurities-removing layer formed on said semiconductor wafer, and
said impurities-removing layer is formed on said semiconductor wafer via a mask layer for said semiconductor device-forming region of said semiconductor wafer, further comprising the step of:
oxidizing portions of said semiconductor wafer located between adjacent masks of said mask layer to form an insulating layer to electrically insulate said semiconductor device-forming region.

22. The removing method as defined in claim 21, wherein said insulating layer is formed by heating said semiconductor wafer at 900° C. or over in an oxidizing atmosphere.

* * * * *